（12） United States Patent
Fujiwara et al.

(10) Patent No.: US 7,075,143 B2
(45) Date of Patent: Jul. 11, 2006

(54) APPARATUS AND METHOD FOR HIGH SENSITIVITY READ OPERATION

(75) Inventors: Ichiro Fujiwara, Kanagawa (JP); Akira Nakagawara, Kanagawa (JP)

(73) Assignee: Sony Corporation (JP)

( * ) Notice: Subject to any disclaimer, the term of this patent is extended or adjusted under 35 U.S.C. 154(b) by 12 days.

(21) Appl. No.: 10/861,570

(22) Filed: Jun. 7, 2004

(65) Prior Publication Data

US 2004/0251488 A1   Dec. 16, 2004

(30) Foreign Application Priority Data

Jun. 12, 2003   (JP) ............................ P2003-167832

(51) Int. Cl.
*H01L 29/792*   (2006.01)
(52) U.S. Cl. ...................... 257/324; 257/314; 257/315; 257/316; 257/320; 257/321; 257/322; 257/326
(58) Field of Classification Search ...................... None
See application file for complete search history.

(56) References Cited

U.S. PATENT DOCUMENTS 5,768,192 A   6/1998   Eitan 6,444,521 B1 *   9/2002   Chang et al. ................ 438/257
6,906,390 B1 *   6/2005   Nomoto et al. ............. 257/406
6,949,788 B1 *   9/2005   Fujiwara et al. ............ 257/314

* cited by examiner

Primary Examiner—Andy Huynh
(74) Attorney, Agent, or Firm—Rader, Fishman & Gauper PLLC; Ronald P. Kauanen

(57) ABSTRACT

A nonvolatile semiconductor memory device enabling a high sensitivity read operation by a low voltage, provided with a gate insulating film comprised of a bottom insulating film, a charge storing film, and a top insulating film successively stacked from the bottom, the bottom insulating film including a silicon oxynitride film directly under the charge storing film, and reading a bit of data stored at a local portion of a sub-source line side of a memory transistor and a bit of data stored at a local portion of a sub-bit line side independently by the reverse read method, whereby the incubation time is suppressed by the presence of silicon oxynitride, the controllability of the thickness of the charge storing film is improved, and the threshold voltage in an erase state is decreased, and a method of high sensitivity reading whereby a lower voltage and improved operational reliability are achieved.

10 Claims, 11 Drawing Sheets

APPARATUS AND METHOD FOR HIGH SENSITIVITY READ OPERATION

BACKGROUND OF THE INVENTION

1. Field of the Invention

The present invention relates to a nonvolatile semiconductor memory device comprised of a memory transistor between whose channel formation region and gate electrode are provided, in order from the bottom layer, a bottom insulating film, a charge storing film having a charge storing ability, and a top insulating film, and a method of reading the same.

2. Description of the Related Art

Nonvolatile semiconductor memory transistors are roughly divided into floating gate (FG) types with charge storing means for storing charges (floating gates) formed planarly contiguous and for example metal-oxide-nitride-oxide semiconductor (MONOS) types with charge storing means (charge traps etc.) formed planarly discrete.

An FG type nonvolatile semiconductor memory transistor is comprised of a semiconductor substrate or well over which a bottom insulating film, a floating gate (FG) comprised of polycrystalline silicon etc., a top insulating film comprised of an oxide-nitride-oxide (ONO) film etc., and a control gate are successively stacked.

A MONOS type nonvolatile semiconductor memory transistor is comprised of a semiconductor substrate or well over which a bottom insulating film, a nitride film mainly for charge storage [$Si_xN_y$ (0<x<1, 0<y<1)], a top insulating film, and a gate electrode are successively stacked.

A MONOS type nonvolatile semiconductor memory transistor has carrier traps serving as the charge storing means extending discretely spatially, that is, in the planar direction and thickness direction, inside of the nitride film or near the interface of the top insulating film and the nitride film. Therefore, its charge retention characteristic depends not only on the thickness of the bottom insulating film, but also the energy and spatial distribution of charges trapped by the carrier traps in the nitride film.

When the bottom insulating film has a local leakage current path due to a defect, with an FG type memory transistor, most of the stored charges will pass through the leakage path and leak out to the substrate side, so the charge retention characteristic will easily deteriorate. On the other hand, with a MONOS type memory transistor, since the charge storing means are spatially discrete, only the locally stored charges near the leakage path will pass through the leakage path and locally leak out, so the charge retention characteristic of the entire memory transistor will not easily deteriorate. Therefore, a MONOS type memory transistor will not suffer from as serious a problem of degradation of the charge retention characteristic due to making the bottom insulating film thinner compared with an FG type memory transistor.

As a leading example of an FG type one-memory transistor cell, the ETOX (EEPROM tunnel oxide) cell of Intel Corporation has been known. As a method of arraying ETOX cells, a common source type memory cell array sharing a source has been adopted.

A MONOS type one-memory transistor cell is being closely looked at from the viewpoints of its ability to reduce the cell area and ease of reduction of the voltage. As the typical example thereof, a high density memory cell is known called an "NROM (nitride read only memory) of Saifun Semiconductors, Ltd. An NROM cell utilizes discrete carrier traps as charge storing means, so it can store two bits of data per cell by injecting charges into different regions in the cell. With the method for arraying NROM cells, the virtual ground array method is adopted where cells adjoining each other in a row direction are made to share an impurity diffusion layer and the function of the impurity diffusion layer is used by switching between the source and drain when storing or reading out two bits of data.

As a method of reading an NROM cell, the method is known of reversing the directions of application voltages at the source and the drain from the directions at the time of the write operation, that is, the "reverse read" method. This is disclosed in U.S. Pat. No. 5,768,192.

The above patent describing the reverse read method discloses a MONOS type transistor formed with a trapping layer sandwiched between two silicon dioxide films between silicon formed with a channel and a gate electrode.

In production of a MONOS type memory transistor, when depositing a nitride film by chemical vapor deposition (CVD) over the bottom insulating film formed by silicon dioxide, a time delay (so-called "incubation time") occurs while forming the film. This is a phenomenon where, for a short while after the start of film formation, time is spent for growing nuclei and almost no film is formed and, after the elapse of a certain time, the film formation rate rapidly increases. The incubation time varies due to the degree of washing and condition of the underlayer and the film formation conditions. An ONO film cannot be formed with good control if incubation time occurs.

If the temperature of forming the nitride film is low, the incubation time tends to become longer when forming the film. However, when forming a MONOS transistor having a gate length of no more than 0.25 μm, the nitride film has to be formed at no more than 800° C. so as to decrease the thermal stress of the entire process. Therefore, in the process of production of a fine MONOS transistor, where the temperature of formation of the nitride film cannot be made too high, the incubation time cannot be decreased.

The above reverse read method enables a high sensitivity read operation with a small charge and therefore is suitable for decreasing the voltage applied in a read operation.

However, if incubation time occurs when depositing a charge storing film (nitride film), in view of the fact that the time will vary, the minimum thickness of the charge storing film has to be able to be secured by making the center of the thickness setting greater than an ideal case without any incubation time. Therefore, the formed charge storing film tends to be thicker than necessary. This becomes a factor obstructing the reduction of voltage by the reverse read method. That is, if the charge storing film is thicker than necessary, the gate voltage cannot be reduced and the low voltage read operation by the reverse read method is no longer possible.

As MONOS transistors are further miniaturized, it will be further necessary to scale down the read voltage correspondingly, but there are limits to the reduction of the read voltage with just the employment of the reverse read method. Therefore, a MONOS memory transistor having a new structure able to further reduce the voltage is earnestly desired.

SUMMARY OF THE INVENTION

An object of the present invention is to provide a nonvolatile semiconductor memory device having a structure enabling a high sensitivity read operation by a low voltage and a method of reading the same.

To achieve the above object, according to a first aspect of the present invention, a nonvolatile semiconductor memory device is provided comprising of a semiconductor substrate, a channel formation region defined at a surface region of the semiconductor substrate, a first source-drain region formed at a surface region of the semiconductor substrate at one side of the channel formation region, a second source-drain region formed at a surface region of the semiconductor substrate at another side of the channel formation region, a gate insulating film including a bottom insulating film, a charge storing film, a top insulating film successively formed on at least the channel formation region, and a gate electrode formed on the top insulating film, wherein the bottom insulating film comprises of a plurality of layers including a silicon oxynitride film directly under the charge storing film and wherein said memory device comprises of a read voltage application circuit for applying a read-drain voltage between said first and second source-drain regions, where the source-drain region at a side of a local portion of said charge storing film at one of said first and second source-drain regions functions as a source, and other source-drain region functions as a drain, when reading a bit of data corresponding to charges injected and stored at the local portion of the charge storing film at one of the first and second source-drain regions.

To achieve the above object, according to a second aspect of the present invention, a method is provided of reading a nonvolatile semiconductor memory device including a semiconductor substrate formed with a memory transistor, the memory transistor having a channel formation region defined at a surface region of the semiconductor substrate, a first source-drain region formed at a surface region of the semiconductor substrate at one side of the channel formation region, a second source-drain region formed at a surface region of the semiconductor substrate at another side of the channel formation region, and a gate insulating film comprised of at least a bottom insulating film, a charge storing film, and a top insulating film successively formed on the channel formation region and a gate electrode formed on the top insulating film, the bottom insulating film being formed by a plurality of layers including a silicon oxynitride film directly under the charge storing film, comprising of reading a bit of data corresponding to charges injected and stored at a local portion of the charge storing film at one of the first and the second source-drain regions by applying a read drain voltage between the first and the second source-drain regions, where the source-drain region of that local portion side functions as a source and the other source-drain region functions as a drain and applying a read gate voltage to the gate electrode.

According to the nonvolatile semiconductor memory device having the above configuration and the method of reading the same, the first and the second source-drain regions are supplied with the read drain voltage using the source-drain region of the local portion side of the charge storing film storing a bit of data to be read as the source and using the source-drain region of the opposite side as the drain and the gate electrode is supplied with the read gate voltage. Due to this, the transistor turns on or off corresponding to the presence of charges or the amount of charge stored at the local portion. As a result, for example, the source-drain region used as the drain has a potential difference. The potential difference is read as the bit of data.

Note that when reading the other bit of data, by making the direction of application of the read drain voltage opposite to that when reading the above bit of data, that other bit of data can be read by a similar action.

In the present invention, since the charge storing film formed on the silicon oxynitride film of the topmost layer of the gate insulating film of the transistor is formed uniformly by the minimum necessary thickness, the read gate voltage applied to the gate electrode when reading the bit of data can be made the minimum necessary voltage. Further, when forming the silicon oxynitride, positive fixed charges or hole traps are increased in the bottom insulating film of the gate insulating film. As a result, the threshold voltage becomes lower. A corresponding lower read gate voltage is therefore used.

According to the nonvolatile semiconductor memory device and the method of reading the same according to the present invention, a read operation is performed by using the reverse polarity of the read drain voltage from a write operation, that is, the "reverse read method", so the read sensitivity is high a corresponding lower voltage read operation is possible. At the same time, since the topmost layer of the gate insulating film is formed by silicon oxynitride, the controllability of the thickness of the charge storing film over it is high. The film can be formed with good control by the minimum necessary thickness and the threshold voltage of the erase state can be decreased. Due to the synergistic effects of the two, low voltage operation becomes possible even without using a boosted voltage and a so-called "logic embedded type memory LSI" can be realized. In addition, the read disturb tolerance and other facts of operation reliability are increased and a one-transistor cell can be realized.

BRIEF DESCRIPTION OF THE DRAWINGS

The above object and features of the present invention will be described in more detail with reference to the accompanying drawings, in which.

DESCRIPTION OF THE PREFERRED EMBODIMENTS

Next, the nonvolatile semiconductor memory device and method of reading the same according to embodiments of the present invention will be explained with reference to the drawings. The embodiments of the present invention will be explained referring to the case of a MONOS type memory transistor with a gate insulating film in which an oxynitride film is formed directly under a charge storing film as an example.

First Embodiment

Figure 1:
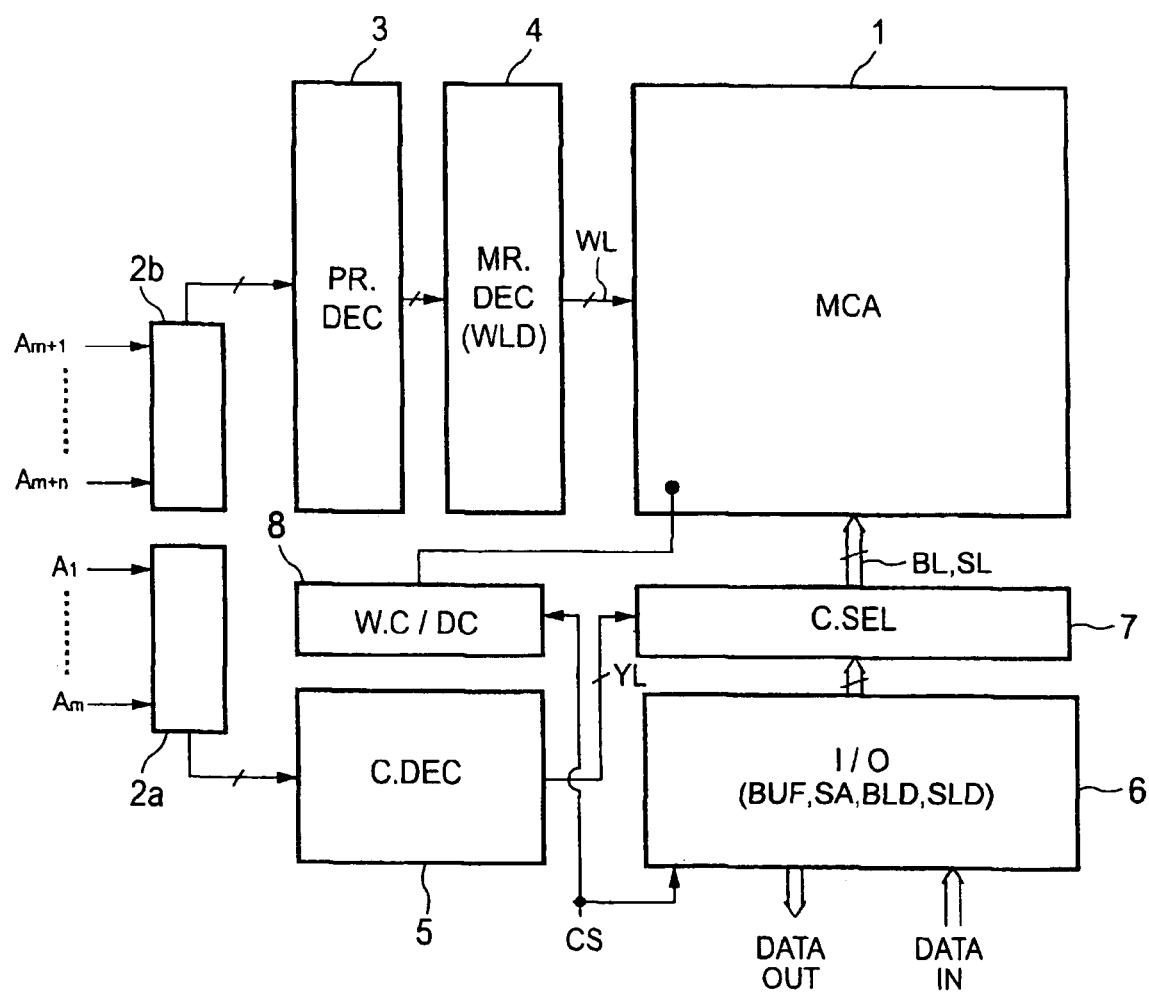
FIG. 1 is a block diagram of the schematic configuration of a nonvolatile semiconductor memory device according to embodiments of the present invention.

FIG. 1 shows the schematic configuration of a nonvolatile semiconductor memory device.

The nonvolatile semiconductor memory device shown in FIG. 1 has a memory cell array (MCA) 1 and memory peripheral circuits controlling operation of the memory cell array 1.

The memory peripheral circuits include a column buffer 2a, a row buffer 2b, a pre-row decoder (PR.DEC) 3, a main row decoder (MR.DEC) 4, a column decoder (C.DEL) 5, an input/output circuit (I/O) 6, a column gate array (C.SEL) 7, and a well charge/discharge circuit (W.C/DC) 8. Note that, when not performing well bias, the well charge/discharge circuit 8 can be omitted. The memory peripheral circuits, while not particularly illustrated, also include a power source circuit for boosting the power source voltage somewhat if necessary and supplying the main row decoder 4 and the well-charge/discharge circuit 8 with the boosted voltage and a control circuit for controlling the power supply.

The input/output circuit 6 includes not only a program and read data buffer (BUF), but also a bit line drive circuit (BLD) for supplying a bit line BL with a predetermined voltage when writing or erasing data, a source line drive circuit (SLD) for supplying a source line SL with a predetermined voltage when writing or erasing data, and a sense amplifier (SA). The input/output circuit 6 and the not illustrated power source circuit supplying the above circuits with power and control circuit constitute an embodiment of the read voltage application circuit of the present invention.

Note that FIG. 1 shows the general memory configuration. The explanation of the functions of the rest of the configuration of the peripheral circuits will be omitted here.

When writing data, a predetermined high level positive voltage of 5 to 9V is supplied to a selected word line $WL_{sel}$ from the word line drive circuit in accordance with address signals $A_{m+1}$ to $A_{m+n}$ while the unselected word lines $WL_{unsel}$ are maintained at 0V for example. When erasing data, the selected word line $WL_{sel}$ is supplied with a predetermined voltage having a reverse polarity to that when writing data of −5V for example and the unselected word lines $WL_{unsel}$ are maintained at a predetermined positive voltage or 0V.

Further, a column select line YL of the selected line designated by the address signals $A_1$ to $A_m$ is selected and a predetermined voltage is supplied. By supplying the column select line YL with a predetermined voltage, a predetermined bit line selection transistor in the column gate array 7 is turned on. Along with this, the selected bit line $BL_{sel}$ is connected to the input/output circuit 6.

In addition, the source line drive circuit in the input/output circuit supplies the source line SL with a ground potential GND.

Due to this, when writing data, the write data in the input/output buffer is supplied to the selected bit line $BL_{sel}$ and written to the memory cell at the intersection of the selected bit line $BL_{sel}$ and the selected and excited word line $WL_{sel}$. Specifically, a positive voltage of about 3.3 to 4.0V or 0V according to the write data is supplied to the selected bit line $BL_{sel}$, whereby the memory cell to which the voltage is supplied is written with data by channel hot electron (CHE) implantation.

In a flash memory, usually the memory cell array is erased all at once or a predetermined block is erased all at once. When erasing a block of data all together, the bit lines BL and the source lines SL in the block are selected in their entirety in accordance with the column address signals and the selected bit lines and source lines are supplied with a predetermined voltage of 5V for example.

Figure 2:
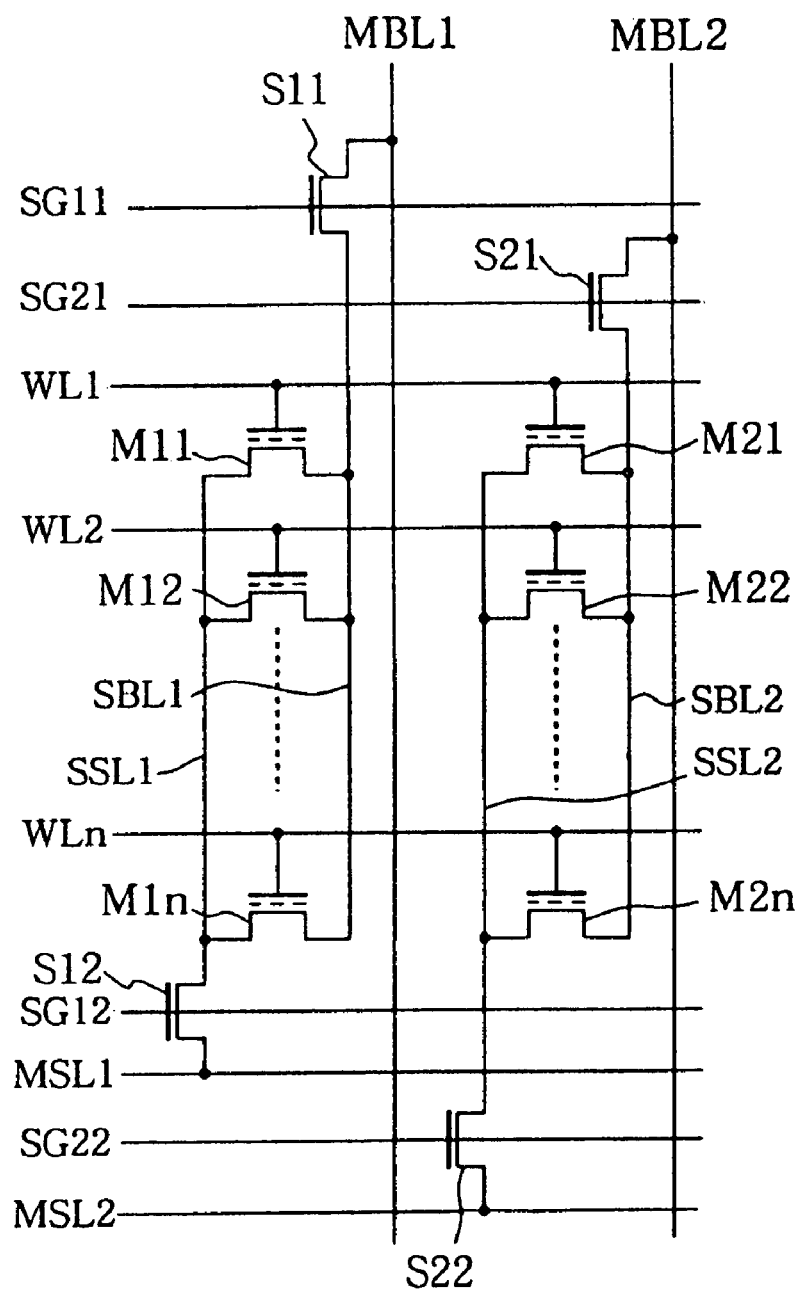
FIG. 2 is a view of the circuit configuration of an SSL type memory cell array according to a first embodiment.
Figure 3:
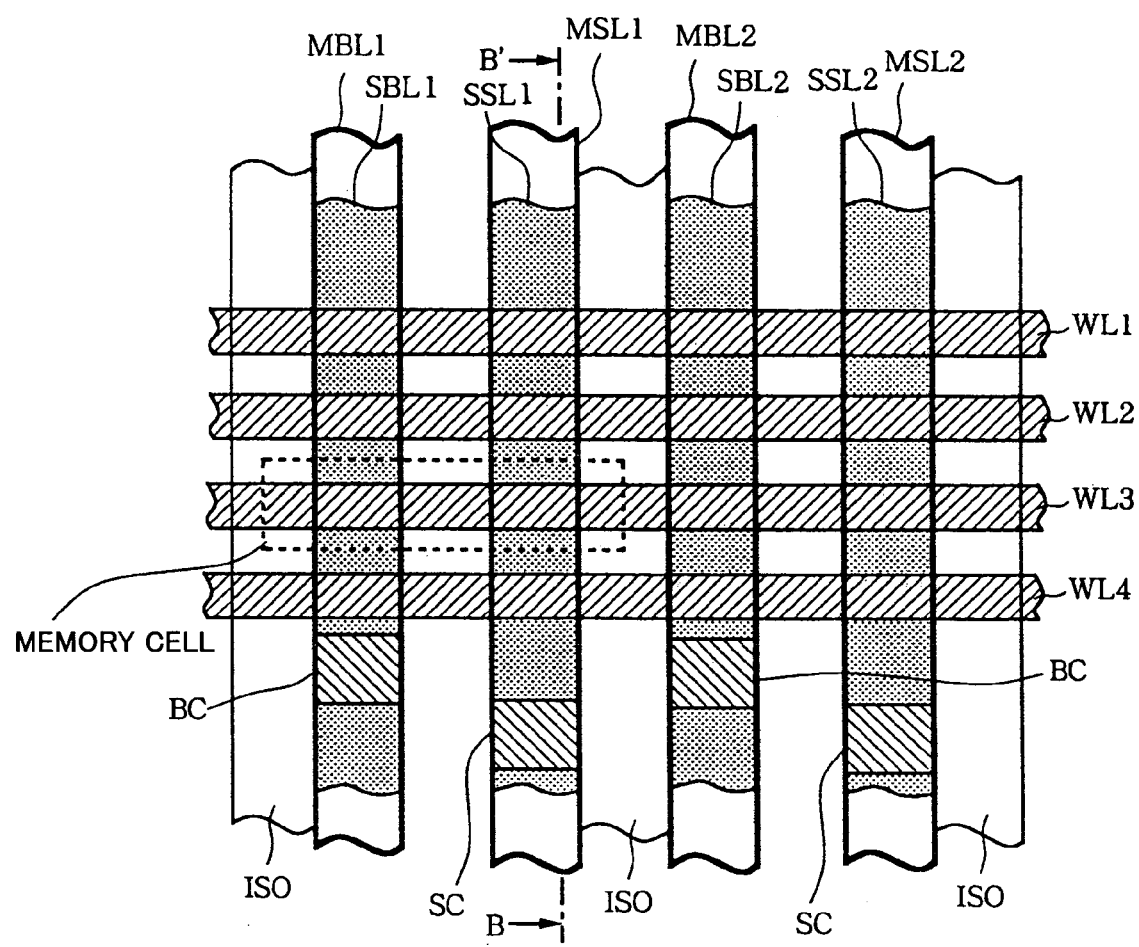
FIG. 3 is a plan view of a memory cell array according to the first embodiment.
Figure 4:
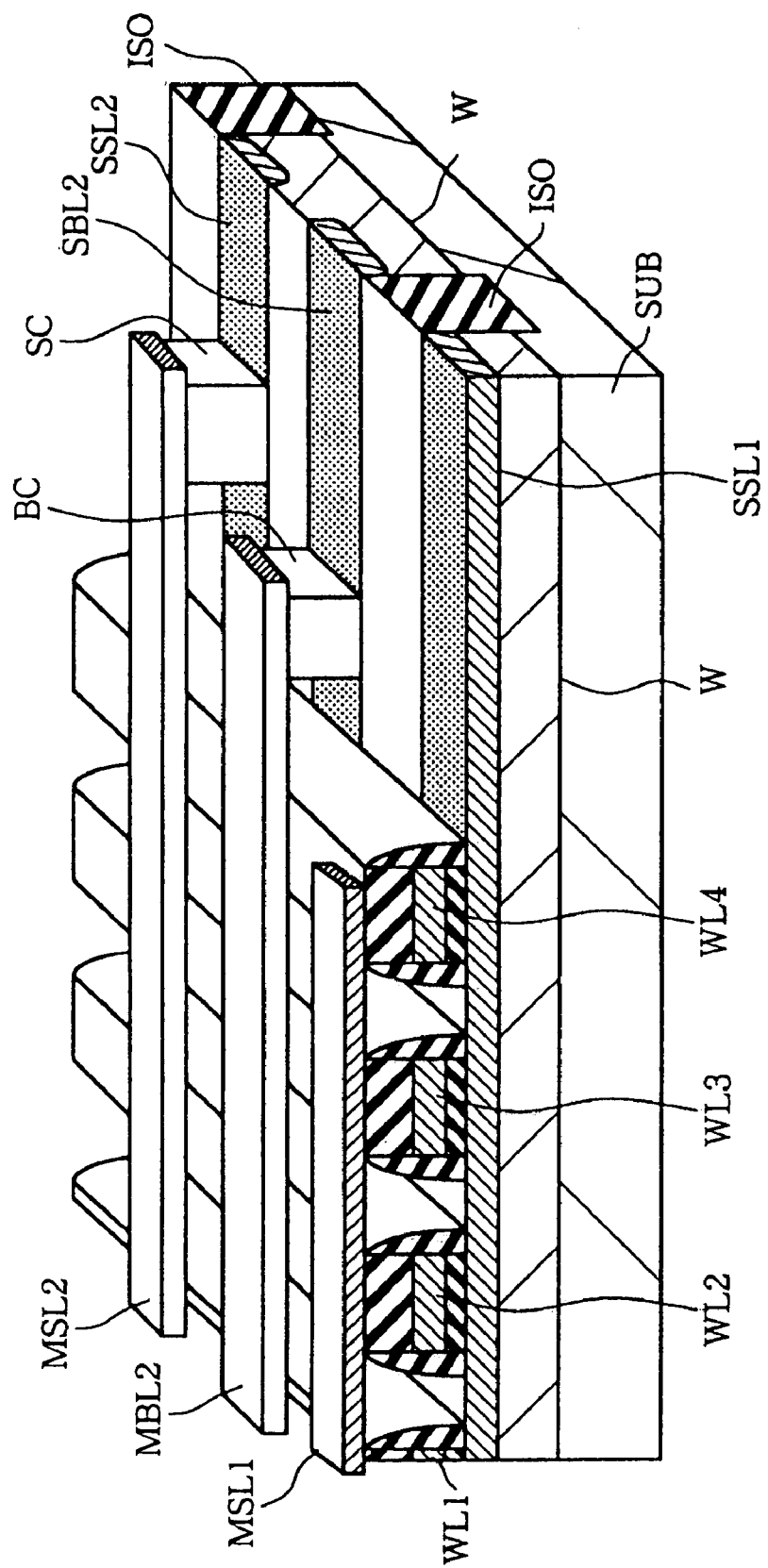
FIG. 4 is a perspective view of the memory cell array according to the first embodiment seen from a cross-section along the line B–B' of FIG. 3.

FIG. 2 shows an example of the circuit configuration of the memory cell array (MCA) 1. The array configuration has hierarchized bit lines and source lines and is a so-called "separated source line (SSL)" type. Further, FIG. 3 is a plan view of the memory cell array, and FIG. 4 is a perspective view as seen from the cross-section along the line B–B' of FIG. 3.

In this memory cell array, the bit lines are hierarchized into main bit lines and sub-bit lines and the source lines are hierarchized into main source lines and sub-source lines.

As shown in FIG. 2, a main bit line MBL1 is connected with a sub-bit line SBL1 via a select transistor S11, and a main bit line MBL2 is connected with a sub-bit line SBL2 via a select transistor S21. A main source line MSL1 is connected with a sub-source line SSL1 via a select transistor S12, and a main source line MSL2 is connected with a sub-source line SSL2 via a select transistor S22.

Between the sub-bit line SBL1 and the sub-source line SSL1, memory transistors M11 to M1n are connected in parallel. For example, "n" is 1 to 64. Between the sub-bit line SBL2 and the sub-source line SSL2, memory transistors M21 to M2n are connected in parallel. The n number of memory transistors connected in parallel with each other and the two select transistors S11 and S12 or S21 and S22 form a block unit constituting part of the memory cell array.

The gates of the memory transistors M11 and M12 adjoining each other in a word direction are connected to a word line WL1. Similarly, the gates of the memory transistors M12 and M22 are connected to a word line WL2, while the gates of the memory transistors M1n and M2n are connected to a word line WLn.

Among the select transistors adjoining each other in the word direction, the select transistor S11 is controlled by a select gate line SG11 and the select transistor S21 is controlled by a select gate line SG21. Similarly, among the select transistors adjoining each other in the word direction, the select transistor S12 is controlled by a select gate line SG12 and the select transistor S22 is controlled by a select gate line SG22. Note that, it is possible to form an array configuration where the select transistors S11 and S21 adjoining each other in the word direction are controlled by the same select gate line, and the select transistors S12 and S22 are controlled by the same select gate line.

In the memory cell array, as shown in FIG. 4, a semiconductor substrate SUB is formed on its surface with p-wells W. The p-wells W are insulated and isolated in a row direction by parallel stripe patterns of an element isolation insulating layer ISO formed by burying trenches with an insulator. Note that a later explained well-in-well (WIW) structure can also be employed.

The p-well portions isolated by the element isolation insulating layer ISO become active regions of the memory transistors. The parallel stripes of well portions separated from each other are injected with an n-type impurity in a high concentration at the two sides of the active regions in the width direction. Therefore, the sub-bit lines SBL1 and SBL2 (hereinafter indicated by SBL) serving as the second source-drain regions and the sub-source lines SSL1 and SSL2 hereinafter indicated by SSL) serving as the first source-drain regions are formed. Note that, with the later explained reverse read method, the sub-bit lines and the sub-source lines are suitably switched in roles as sources and drains without being restricted by their names.

A multilayer insulating film of a gate insulating film having parallel stripe pattern shapes and including a charge storing film are formed over the sub-bit lines SBL and the sub-source lines SSL. Word lines WL1, WL2, WL3, and WL4 (hereinafter indicated by WL) serving also as gate electrodes are formed over the gate insulating film.

In the portions of the p-wells W between the sub-bit lines SBL and the sub-source lines SSL, the portions intersecting the word lines WL are the channel formation regions of the memory transistors.

The top surfaces and the side walls of the word lines WL are covered by an offset insulating layer and a sidewall insulating layer. In the present embodiment, a usual interlayer insulating layer can be used.

These insulating layers are formed with bit contact plugs BC reaching the sub-bit lines SBL at predetermined intervals and source contact plugs SC reaching the sub-source lines SSL at predetermined intervals. The contact plugs BC and SC are formed by polycrystalline silicon, a refractory metal, or other conductor, for example, a plug, and are provided for every group of memory transistors, for example, for every 64 memory transistors, in the bit direction.

The insulating film is alternately formed with the main bit lines MBL1 and MBL2 (hereinafter indicated by MBL) contacting the bit contact plugs BC and the main source lines MSL1 and MSL2 (hereinafter indicated by MSL) contacting the source contact plugs SC. The main bit lines and the main source lines are shaped as long parallel stripes in the column direction.

In the illustrated memory cell array, the bit lines and source lines are hierarchized. The bit contact plugs BC and the source contact plugs SC do not have to be formed for every memory cell. Therefore, there is basically no variation between the cells in the contact resistance. A bit contact plug BC and a source contact plug SC are formed for example for every 64 memory cells. When the bit contact plugs BC and the source contact plugs SC are not formed by self-alignment, the offset insulating layer and the sidewall insulating layer are not necessary. In this case, an ordinary interlayer insulating film is deposited thickly to bury the memory transistors, then contacts are formed by usual photolithography and etching, and a conductive material is buried in the contacts.

The memory cell array has a quasi-contactless structure in which the sub-bit lines SBL (second source-drain regions) and the sub-source lines SSL (first source-drain regions) are configured by impurity regions.

Due to this, there is almost no wasted space, so when forming the layers at the minimum dimension F of the limit in a wafer process, cells of very small areas close to 8 $F^2$ can be realized.

Since the bit lines and the source lines are hierarchized, the select transistor S11 or S12 electrically cut off the group of parallel memory transistors of the unselected unit blocks from the main bit lines MBL. Therefore, the capacity of the main bit lines MBL is remarkably decreased. This is favorable for increasing the speed and lowering the power consumption. Due to the action of the select transistor S12 or S22, the sub-source lines SSL are separated from the main source lines MSL and the capacity can be lowered.

For achieving higher speed, the sub-bit lines SBL and the sub-source lines SSL are formed above them with an alloy layer of refractory metal and silicon (silicide) by for example the "salicide method". The main bit lines MBL and the main source lines MSL are formed by metal interconnects.

Figure 5:
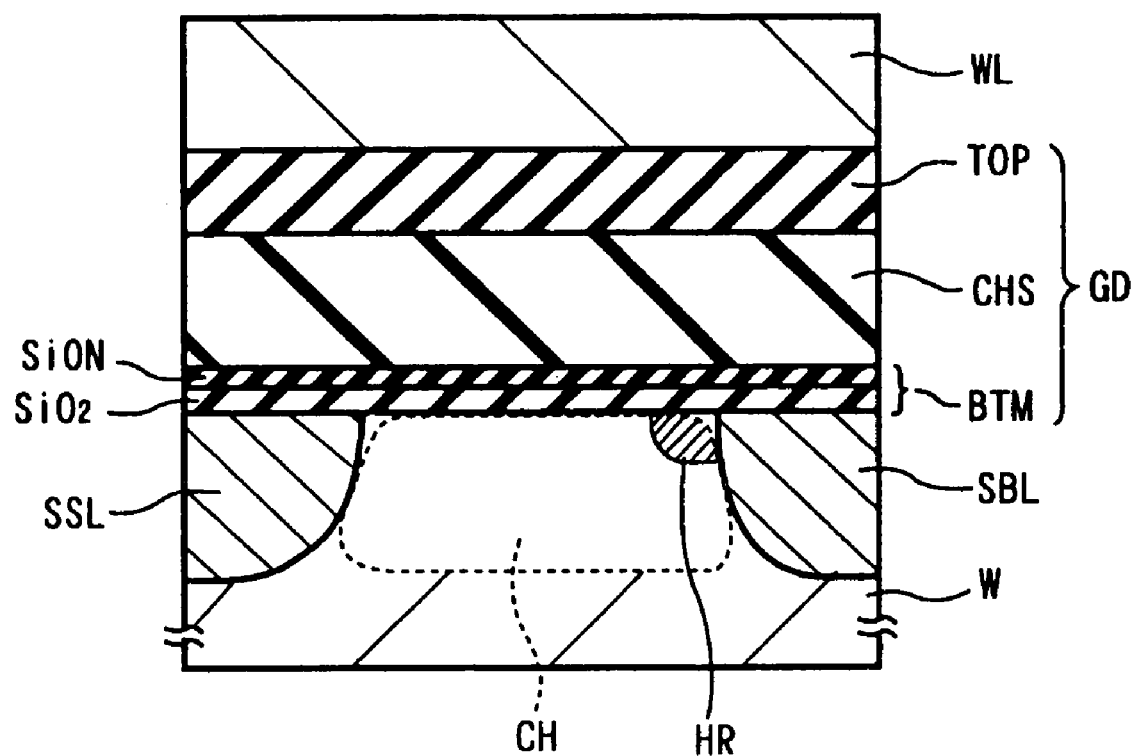
FIG. 5 is a cross-sectional view in a channel direction of the memory transistor according to the first embodiment.

FIG. 5 is an enlarged cross-sectional view in the row direction (hereinafter called as channel direction) of a memory transistor.

In FIG. 5, the portion between the sub-bit line SBL of the second source-drain region and the sub-source line SSL of the first source-drain region intersecting the word line WL is the channel formation region CH of the memory transistor.

A gate insulating film GD is formed over the channel formation region CH, while the gate insulating film GD is formed over it with a gate electrode (word line WL) of the memory transistor. The word line WL is formed by polycrystalline silicon doped with a p-type or an n-type impurity at a high concentration to make it conductive, a refractory metal silicide, or a multilayer film of the doped polycrystalline silicon and the refractory metal silicide. An active portion of the word line WL, that is, the length in the channel direction (gate length) corresponding to a distance between the source and the drain, is no more than 250 nm, for example about 130 nm.

The gate insulating film GD is comprised of a bottom insulating film BTM, a charge storing film CHS, and a top insulating film TOP successively from the bottom layer.

The bottom insulating film BTM in the present embodiment is thermally oxidized with the channel formation region to form a silicon dioxide film and thermally nitrided at its surface. Due to this, the bottom insulating film BTM is comprised by several layers, for example, two layers in the present embodiment. In other words, the bottom insulating film BTM is comprised of the lower layer silicon dioxide ($SiO_2$) film and the upper layer silicon oxynitride (SiON) film directly under the charge storing film CHS (nitride film).

The thermal nitridation may be performed by a dedicated system or in the CVD system used for forming the nitride film. In the latter case, a wafer formed with a silicon dioxide film is loaded in the CVD system and nitride-annealed in ammonia gas at a substrate temperature of over 750° C., more preferably no less than 800° C., then the gas system is changed to the mixed gas of ammonia and a nitrogen-based gas at the time of formation of the nitride film for example and a nitride film (charge storing film CHS) is formed by CVD at a substrate temperature of 650° C. to 750° C. for example.

The thickness of the bottom insulating film BTM can be set to 2 to 9 nm for example. In the present embodiment, it is set to 4 to 9 nm.

The charge storing film CHS is formed by a silicon nitride $Si_xN_y$ (0<x<1, 0<y<1) film having a thickness of around 10 nm for example. The charge storing film CHS is formed by low-pressure CVD (LP-CVD) for example and contains a large number of carrier traps. The charge storing film CHS has a Frenkel-Poole (FP) type electroconductivity.

Deep carrier traps have to be formed at a high density near the interface of the top insulating film TOP and the charge storing film CHS. Therefore, the charge storing film CHS is formed by thermal oxidation of the surface of the nitride film (charge storing film CHS) after formation or the top insulating film TOP is formed by a high temperature CVD oxidation film (HTO). When forming the top insulating film TOP by CVD, the carrier traps are formed by thermal treatment. The thickness of the top insulating film has to be at least 3.0 nm, preferably no less than 3.5 nm, for effectively blocking the injection of holes and preventing a decrease in the number of data rewrites. In the present embodiment, the thickness is 4.5 nm.

Figure 6:
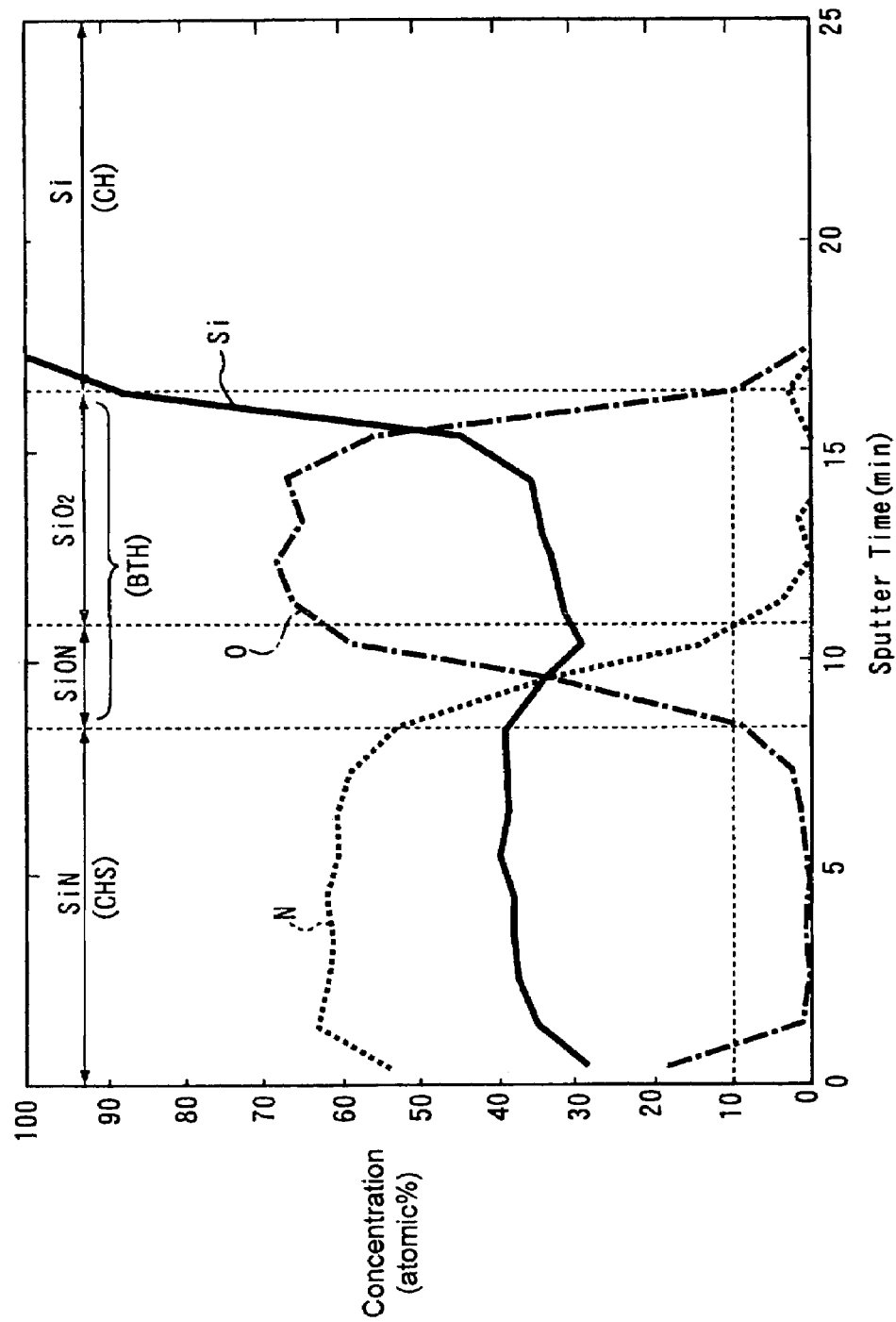
FIG. 6 is a graph showing results of SIMS analysis of a multilayer film of a bottom film and a charge storing film on a silicon substrate.

FIG. 6 shows results of analysis by Auger electron spectroscopy (hereinafter called "AES") of the multilayer film of the bottom film and the charge storing film on the silicon substrate. It shows that a silicon oxynitride film serving as a layer above the bottom insulating film BTM is formed between the silicon dioxide film below the bottom insulating film BTM and the silicon nitride film serving as the charge string film CHS. If the detection limit of AES is 10%, the thickness of the silicon oxynitride film is sufficiently thicker than a structure transition layer formed when depositing a silicon nitride film on a silicon dioxide film by the CVD method. Due to this, it is proved that the silicon oxynitride film is a film formed by special treatment, for example, by thermal nitridization with the surface of the silicon dioxide film.

Next, a method of producing memory transistors having the above configuration will be simply explained.

First, a semiconductor substrate SUB is formed with an element isolation insulating film ISO and p-wells W. Impurity regions of the first and second source-drain regions serving as the sub-bit lines SBL and the sub-source lines SSL are formed by ion implantation. If necessary, ion implantation is performed for controlling the threshold voltage.

Next, the gate insulating film GD is formed over the semiconductor substrate SUB formed with the p-wells W and the element isolation insulating film ISO.

In more detail, a silicon wafer is thermally treated by the high temperature dry oxidization method to form a silicon dioxide film (layer below the bottom insulating layer BTM). For suppressing the incubation time at the time of formation of the nitride film, the thermal treatment is performed in ammonia gas at a temperature of over 750° C., preferably no less than 800° C., to make the surface of the silicon oxide film silicon oxynitride. As a result, a silicon oxynitride film is formed over the bottom insulating film BTM. Then, the bottom insulating film BTM has a thicker silicon nitride film (charge storing film CHS) deposited over it by LP-CVD so as to obtain a final thickness of 10 nm. At that time, due to the silicon oxynitride film, the nitride film is smoothly formed. The CVD is performed by using a mixed gas of dichlorosilane (DCS) and ammonia at a substrate temperature of 680° C.

The formed silicon nitride film is oxidized at its surface by thermal oxidation to form a silicon oxide film serving (top insulating film TOP) of 4 nm for example. The thermal oxidation is performed in an $H_2O$ atmosphere at a furnace temperature of 950° C. for about 40 minutes. As a result, deep carrier traps of trap levels (energy difference from a conduction band of the silicon nitride film) of no more than 2.0 eV are formed at a density of about 1 to $2 \times 10^{13}/cm^2$. Further, the thermal oxide silicon film (top insulating film TOP) is formed at a thickness of 1.5 nm for a silicon nitride film (charge storing film CHS) of 1 nm. The underlying silicon nitride film is decreased in thickness by the above ratio, whereby the final thickness of the silicon nitride becomes 10 nm.

The multilayer film of the conductive film for forming the gate electrodes of the word lines WL and the offset insulating layer (not shown) are stacked and processed to the same patterns at one time.

Then, to form the memory cell array structure shown in FIG. 4, self-alignment contact portions are formed along with a sidewall insulating layer, and the sub-bit lines SBL and the sub-source lines SSL exposed from the self-alignment contact portions are formed with bit contact plugs BC and source contact plugs SC.

The surroundings of these plugs are buried by the interlayer insulating film. The interlayer insulating film is formed above it with the main bit lines MBL and the main source lines MSL. Then, when necessary, an interlayer insulating layer is deposited and contacts and/or upper layer interconnects are formed. Finally, an overcoat is formed, pads are formed, and other steps performed to finish the nonvolatile memory cell array.

Next, an example of a bias setting and operation of the SSL type nonvolatile memory cell array shown in FIG. 2 will be explained.

Figure 7:
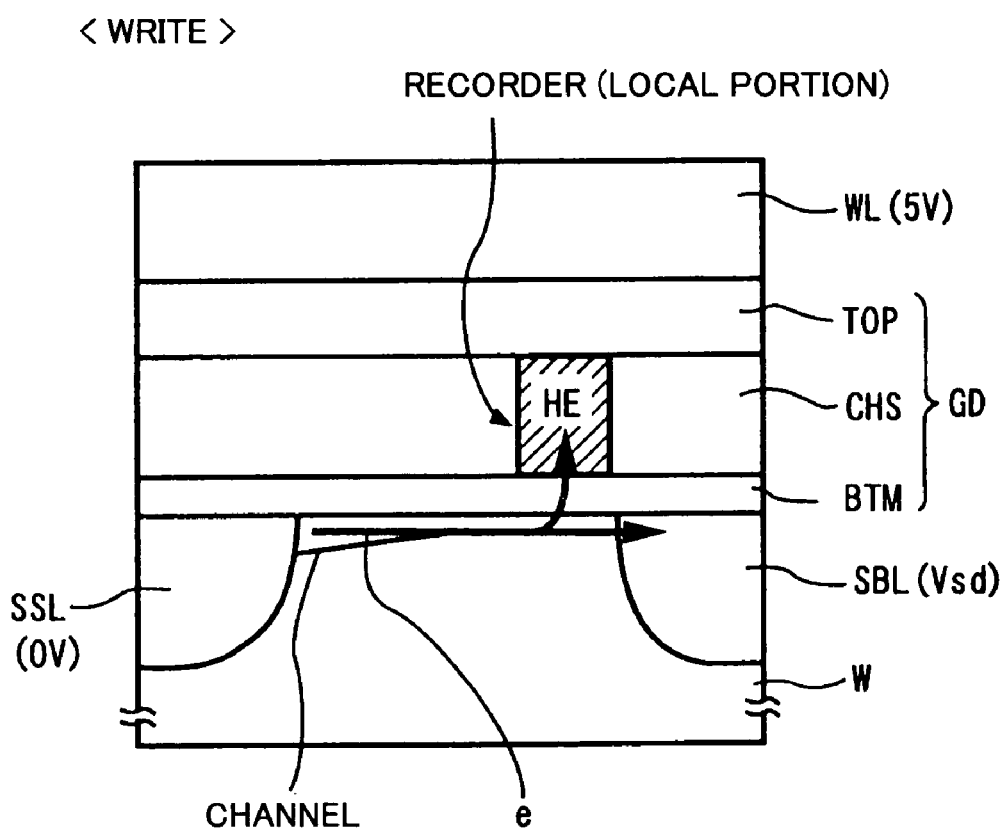
FIG. 7 is a conceptual view of a data write operation according to the first embodiment.

FIG. 7 is a conceptual view of a data write operation (hot electron injection).

Data is written by injecting hot electrons produced by applying a high electric field to the channel.

Specifically, in a channel, as shown in FIG. 7, based on a voltage 0V of the source (sub-source line SSL), the gate (word line WL) is supplied with a drain voltage Vsd of 9V and the drain serving (sub-bit line SBL) is supplied with 4.5V.

Under bias conditions, part of the electrons esupplied from the sub-source line SSL and traveling over the channel becomes high energy hot electrons HE at the drain side. The hot electrons HE ride over the potential barrier of the bottom insulating film BTM and are captured by the carrier traps in the charge storing film CHS. The local portion (storing part) of the charge storing film is limited to part of the drain side.

Data is erased by injecting hot holes arising due to the tunneling effect between the bands. Specifically, for example, the gate (word line WL) is supplied with −5V and the drain (sub-bit line SBL) is supplied with 5V. At that time, the source (sub-source line SSL) is open.

Under the bias conditions, due to the voltage of 10 to 12V applied between the word line WL and the sub-bit line SBL, the hot holes are injected at the carrier traps in the charge storing film CHS (nitride film) from the drain edge.

Due to injection of the hot holes, the charge of the hot electrons HE injected when writing data is cancelled out and the memory transistor shifts to an erased state.

Data may be read for every bit or for every page. Note that, in the present embodiment, the polarity of the voltage between the source and the drain is reversed from that when writing data, that is, the reverse read method is used. The conditions of a reverse read operation are a gate voltage of 3.3V and a voltage applied to the source-drain region used as the source when writing data of 1.5V. The source-drain region used as the drain when writing data is maintained at the ground potential GND.

Figure 8:
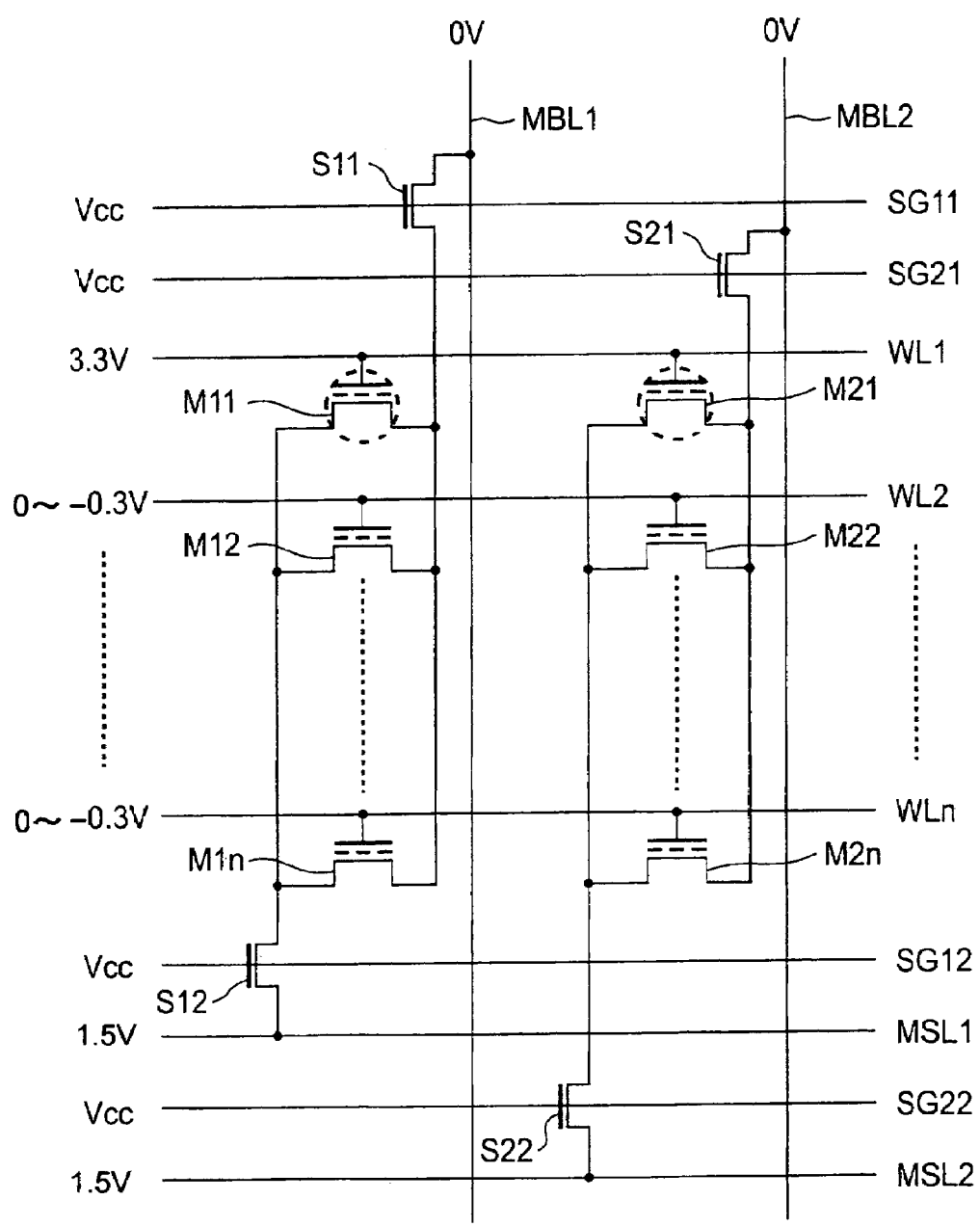
FIG. 8 is a circuit diagram of bias conditions in the first embodiment when reading by a reverse read a second bit of data written at a second local portion at the side where the main bit line MBL is connected.

FIG. 8 is a circuit diagram showing the bias conditions when reading a bit of data written at a local portion of the side where the main bit line MBL is connected by a reverse read operation. Here, the unselected word lines are biased by a somewhat negative voltage. Although not essential, since the read leakage current is decreased, the above bias is more preferable.

In the present embodiment, since a silicon oxynitride film is formed between the silicon oxide film forming the bottom insulating film and the charge storing film, the morphology of the surface of the bottom insulating film is improved and the uniformity of the distribution of the thickness is improved. Therefore, the reliability of the film is improved. As a result, the read disturb tolerance is improved. Since the controllability of the thickness of the charge storing film CHS is improved, the gate voltage can be controlled in the minimum necessary value.

Note that, as explained above, the reverse read method can be used to read individual bits rather than pages. For example, if trying to read the memory cell M11 shown in FIG. 8, the adjacent memory cell M21 is prevented from being read by maintaining the two source-drain regions at 0V or in the floating state. In this case as well, due to the improvement in the reliability of the bottom insulating film and control of the gate voltage explained above, the unselected memory cell M21 becomes resistant to electrical stress which would place it in a weak write state while the memory cell M11 is being read. Further, as it becomes resistant to electrical stress, disturbance at the time of the reverse read can be effectively prevented.

The memory cell array is supplied with the voltages required for its operations from various drivers of the memory peripheral circuits for example.

The memory peripheral circuits supply a drain voltage Vsd of 3.5 to 4.5V and a gate voltage Vg of 5 to 9V when writing data.

The memory peripheral circuits generate a first polarity voltage (5 to 6V) and a second polarity voltage (−6 to −5V) to give a potential difference (10 to 12V) between the gate and the substrate. The first polarity voltage (5V) is supplied to the second source-drain region, while the second polarity voltage (5V) is supplied to the gate.

In the nonvolatile memory device of the present embodiment, since a silicon oxynitride film is formed over the bottom insulating film BTM by thermal nitridation, the bottom insulating film is formed with a high nitrogen concentration and a positive fixed charge. As a result, the threshold voltage when erasing data is decreased. Therefore, the voltage of 3.3V applied to the gate electrode (word line WL) when reading data can be further lowered. Data can be read using a lower voltage compared with no thermal nitridation.

As explained above, the word line and the drain are supplied with the first polarity voltage and the second polarity voltage having reverse polarities and generated individually. Due to this, a high withstand voltage transistor corresponding to a program voltage $V_{PP}$ is not necessary and the thickness and the gate length of the gate insulating film can be scaled down.

A memory cell array formed with the above configuration was examined for the current-voltage characteristics of the memory transistors in the write state and the erase state.

As a result, the off leakage current from an unselected cell in the case of a drain voltage of 1.0 to 1.5V becomes small (about 1 nA) when biasing the unselected word line to about −0.3V when reading data. Since the read current in this case is more than 1 μA, an unselected cell will not be erroneously read. Therefore, there is a sufficient margin of a punch though withstand voltage when reading data in a MONOS type memory transistor having a gate length of 130 nm.

The read disturb tolerance at a gate voltage of 3.3V was also examined, whereupon it was found to be possible to read data even after the elapse of more than $3 \times 10^8$ seconds.

The data rewrite characteristic and the data retention characteristic of the memory transistor were also examined.

As a result, it was found that a sufficient threshold voltage difference is maintained up to 100,000 data rewrites and the data retention characteristic was maintained at 85° C. for 10 years after rewriting data 100,000 times.

Through various studies, it was found that to suppress punch though at a drain voltage of 2.5 to 3.3V when writing data, the impurity concentration of the channel has to be more than $5 \times 10^{17}$ cm$^{-3}$.

Due to the above, it could be confirmed that a MONOS type nonvolatile memory transistor has sufficient characteristics even if the gate length thereof is shorter than 180 nm.

Most system LSIs designed to realize entire systems or sub-systems in single LSIs mount nonvolatile memories. The nonvolatile memories for such system LSI applications can be formed by common processes as CMOS processes and are required to provide various high performance based on high speed.

The nonvolatile memory device of the present embodiment realizes high speed operation while not requiring special gate structures such as FG type floating gates or source side injection MONOS types. Therefore, the number of process steps and the number of photomasks are small, there is high commonality with the CMOS process, and there is high total performance as a system LSI or other mixed application nonvolatile memory.

Second Embodiment

Figure 9:
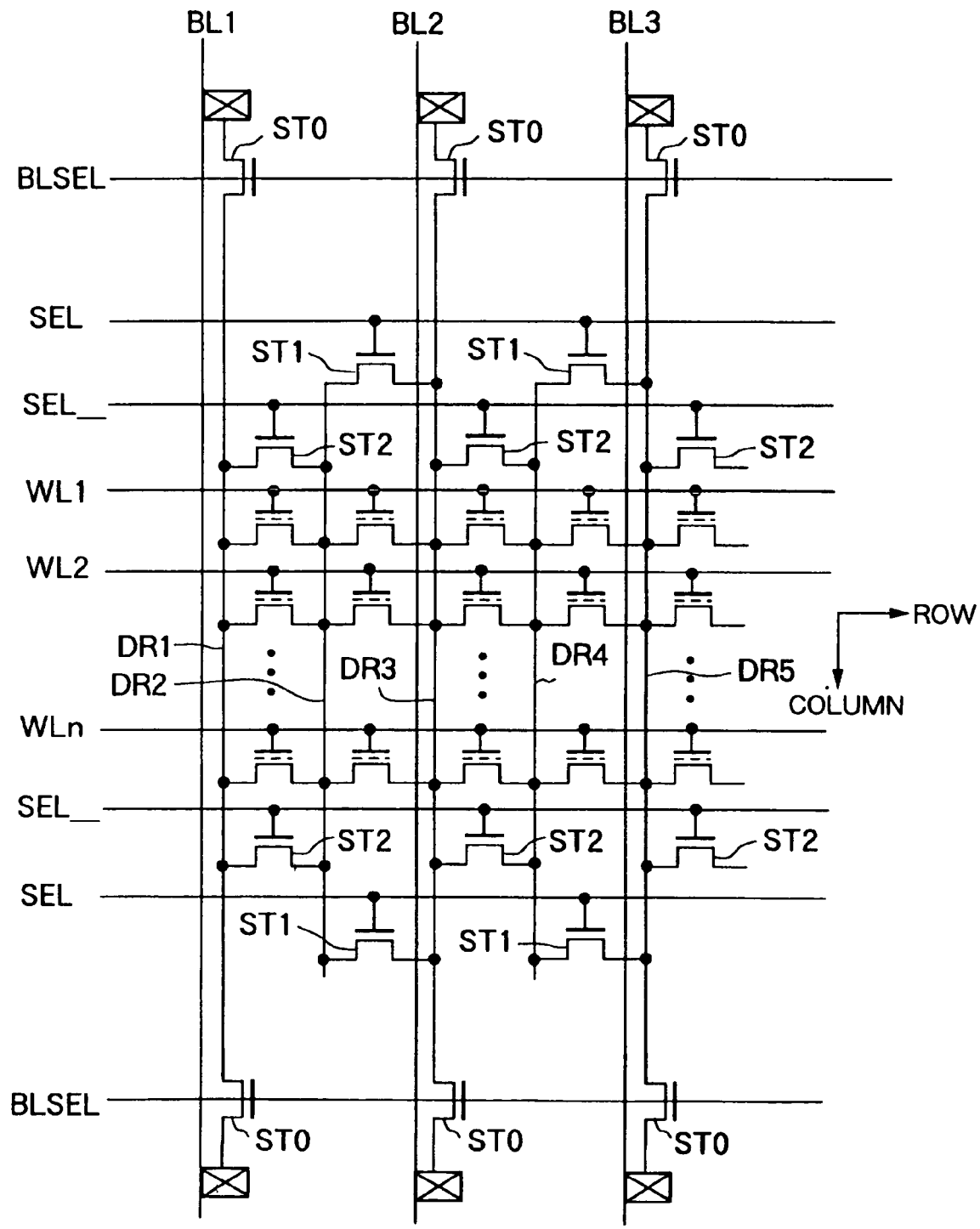
FIG. 9 is a view of the circuit configuration of an AMG type memory cell array according to a second embodiment.

In the second embodiment, an alternate metal virtual ground (AMG) type memory cell array shown in FIG. 9 is used. The method of memory cell operation is based on writing data by low voltage hot electrons and erasing data by hot hole injection by the tunnel effect between bands. For example, the method of operation of the first embodiment can be adopted.

The memory cell array shown in FIG. 9 is comprised of n×m number of memory transistors forming memory cells arranged in a matrix. The gates of the memory transistors arranged in the row directions are connected to the word lines WL1, WL2, or WL3.

Impurity diffusion layers DR1, DR2, and DR5 are formed in a column direction and are repeated at specific interval in the row direction. The impurity diffusion layers DR1, DR2, and DR5 function as the first or the second source-drain regions and are shared by adjoining memory transistor columns.

The odd numbered impurity diffusion layers DR1, DR3, and DR5 are connected to the bit lines BL1, BL2, and BL3 arranged above them via the select transistor ST0. The select transistor ST0 is controlled by a bit line selection signal BLSEL. The bit lines are formed by a metal layer, for example, an aluminum layer.

The even numbered impurity diffusion layers DR2 and DR4 are formed at the substantial centers between the bit lines and are able to be selectively connected to either of the bit lines at the two sides. The even numbered impurity diffusion layers DR2 and DR4 are connected to one of the bit lines BL2 and BL3 via a select transistor ST1 controlled by the selection signal SEL. Further, the even numbered impurity diffusion layers DR2 and DR4 are connected to the other of the bit lines BL2 and BL3 via a select transistor ST2 controlled by reverse signal SEL_ of the selection signal.

The n×m number of memory transistors and the three different types of the select transistors ST0, ST1, and ST2 form a basic unit (sub-array). Sub arrays are arranged repeatedly to form the overall memory cell array.

The structure of each memory transistor including the gate insulating film GD and the method of forming the same are similar to the first embodiment. The configuration of the memory peripheral circuits is similar to the first embodiment explained by using FIG. 1. Further, data is written, erased, and read by the same methods as the first embodiment. That is, data can be written by hot electron injection utilizing collisional ionization and can be erased by hot hole injection due to the tunnel effect between bands. Further, data can be written by hot electron injection due to the tunnel effect between bands.

When writing and erasing data, similar to the first embodiment, the first polarity voltage and the second polarity voltage are separately generated and applied as the voltages are needed for writing data. Further, the first polarity voltage and the second polarity voltage are separately generated and applied as the voltages are needed for erasing data.

Data is read by the reverse read method. In this case, since a high quality bottom insulating film is formed and the gate voltage can be controlled to the minimum necessary value in the present embodiment as well, the disturb tolerance at the time of a reverse read and other aspects of the reliability can be improved.

To further improve the efficiency of the hot electron injection, a p-type high concentration channel region may be formed in the same way as the first embodiment.

Due to its configuration, in an AMG type memory cell array, memory cells can only be selected at every other row of column of the prepared memory cell. However, by setting the number of cell columns of the sub-arrays to double the number of the data bits required and switching the operable memory cell columns between the odd numbered columns and even numbered columns, substantially of the memory cells can be effectively used for storing data.

Further, due to the column switchable configuration, unlike with the general VG type memory cell array, operation in page units is possible.

Further, since the requirement on the interval between the bit lines is eased, even if the memory transistors are miniaturized, the pitch of the bit lines will not act to limit the reduction of the area of the memory cell array.

Third Embodiment

The third embodiment relates to a nonvolatile semiconductor memory improved in charge injection efficiency and enabling a lower voltage. Here, both a case of storing one bit of data in one memory cell and a case of storing two bits of data in one memory cell will be explained. Note that while the above first embodiment differs in method of writing data from the present embodiment, storage of two bits of data itself is also possible in the first embodiment. Further, the following explanation is based on the cell array of the first embodiment, so FIGS. 1 to 4 are applied to the present embodiment. Note that the cell array of the second embodiment also does not exclude the possibility of application of the method of writing data and the impurity distribution structure of the present embodiment.

In the present embodiment, two methods are employed for improving the charge injection efficiency.

The first relates to the write method. Data is written by injecting hot electrons by collisional ionization, for example, secondary collisional ionization. In writing data by hot electron injection using collisional ionization, the well is desirably biased negatively. In this case, the selected well is supplied with about −4 to 1.5V for example. The voltage is charged at a predetermined reverse bias voltage, for example a negative voltage, by a well charge-discharge circuit 8 controlled by a control signal CS (shown in FIG. 1) only when writing data in a well of the memory cell array. As shown in FIG. 4, when wells are divided into long parallel stripes in the bit line direction, a well can be selected based on the column address in the configuration of FIG. 1.

The second relates to the structure of the impurity distribution for raising the intensity of the electric field at the drain edge. A high concentration impurity region (hereinafter called a high concentration channel region) having the same conductivity type as the channel is provided at the drain edge. Note that formation of a high concentration impurity region can also be applied to the first embodiment.

Figure 10A:
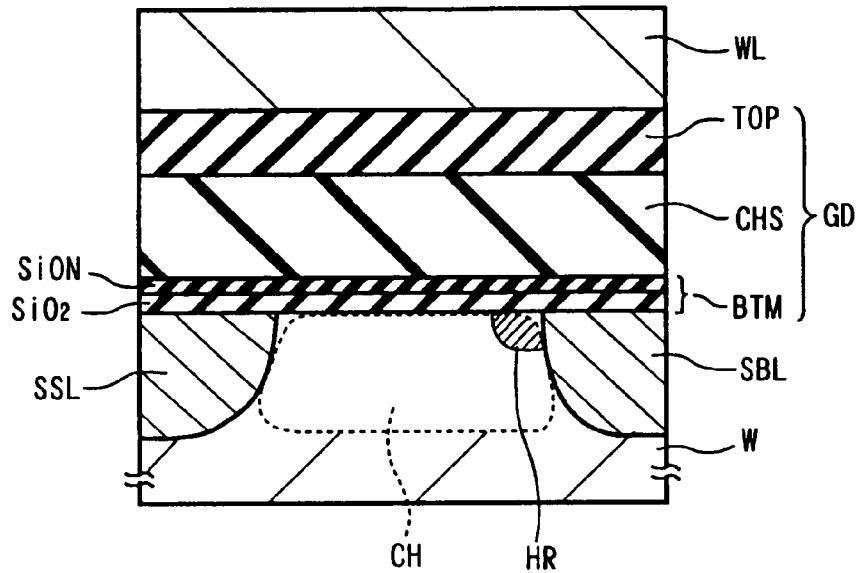
FIGS. 10A and 10B are cross-sectional views in the channel direction of a memory transistor according to a third embodiment.
Figure 10B:
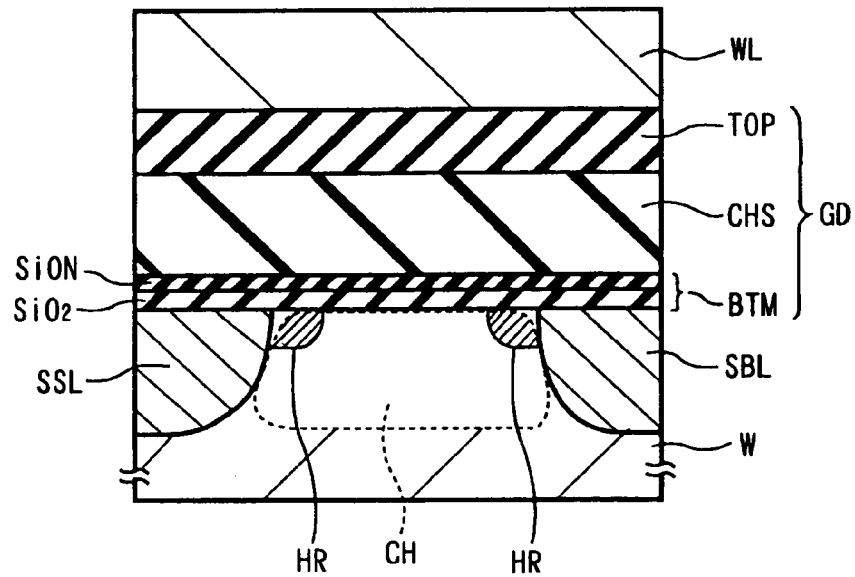

FIG. 10A is a cross-sectional view in a channel direction of the memory transistor for storage of one bit of data, while FIG. 10B is a cross-sectional view in the channel direction of the memory transistor for storage of two bits of data.

In FIGS. 10A and 10B, a channel formation region CH is formed with a high concentration channel region HR contacting the sub-bit line SBL. The high concentration channel region HR is p-type with a higher concentration than the portion of the channel formation region CH. The high concentration channel region HR has a part in increasing the intensity of the electric field in the channel direction at the portion contacting the channel formation region CH.

Further, in the case of FIG. 10B, the portion contacting the sub-source line SSL is formed with a high concentration region HR. In a memory transistor for storing two bits of data, the sub-bit line SBL and the sub-source line SSL are switched in function thereof (source and drain) and voltage supplied to them. At that time, since the intensity of the electric field becomes large at the side contacting the sub-source line SSL, it is easy to write data.

A high concentration channel region HR is injected with the p-type impurity at a lower portion of the gate edge by a tilt ion injection after patterning the gate.

Figure 11A:
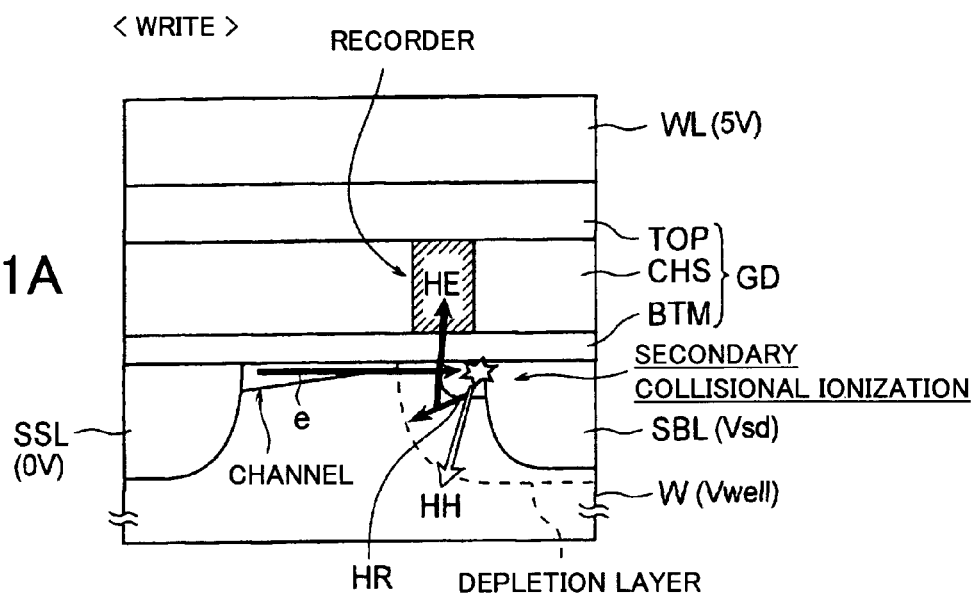
FIG. 11A is a conceptual view of a data write operation according to the third embodiment and FIG. 11B is a view showing an accelerating field of electrons in the channel direction.
Figure 11B:

FIG. 11A is a conceptual view of a data write operation, that is, a conceptual view of hot electron injection. FIG. 11B is a graph showing an accelerating field of electrons in the channel direction.

When writing data, as shown in FIG. 11A, based on the voltage 0V of the source of the sub-source line SSL, the gate of the word line WL is supplied with 5V and the drain of the sub-bit line SBL is supplied with 3.5V. Further, the p-well is supplied with a voltage $V_{well}$ of 3V as a back bias. The voltage is supplied in a direction making the p-n junction between the p-well and the sub-bit line of the first source-drain region SSL or the sub-bit line of the second source-drain region SBL a reverse bias. At that time, the voltage supplied between the second source-drain region and the well is selected to be smaller than the withstand voltage between the second source-drain region and the well.

Under bias conditions, the electrons e supplied from the sub-source line SSL and traveling over the channel collides with a silicon lattice in a depletion layer of the sub-bit line SBL side of the drain side or are scattered to form pairs of high energy holes HH and electrons HE. The hot holes HH are accelerated in the depletion layer of the p-n junction to collide with the lattice to thereby form pairs of electrons and holes again. The inside electrons become hot electrons HE which drift while part head to the word line WL side and are accelerated by a perpendicular direction electric field. As a result, the high energy hot electrons HE ride over the potential barrier of the bottom insulating film BTM and are captured by the carrier traps in the charge storing film CHS. The storage region of the charge storing region (second local portion) is limited to part of the drain side.

The hot electrons HE produced by the collisional ionization may be produced by a lower electric field by the CHE injection method of accelerating them in the channel to increase the energy.

Here, since the high concentration channel region HR is formed, as shown in FIG. 11B, the electric field in the channel direction is higher in intensity than when not providing the high concentration channel region HR shown by a broken line. As a result, the energy of the channel drift electrons e colliding with the silicon lattice becomes high. Alternately, for obtaining the same energy, the voltage between the source-drain regions may be made lower. In the present embodiment, formation of the high concentration channel region HR is not essential, but due to the above reasons, formation of the high concentration region HR is more preferable.

Further, since the p-n junction between a p-well W and an $n^+$ impurity region serving as the sub-bit line is reverse-biased due to the back bias, the depletion layer easily spreads by a lower drain voltage. Further, even if the applied voltage of the gate electrode is lower than when not back-biasing, the required injection efficiency of the hot electrons is easily obtained.

The write characteristics based on the above write method were measured by using the substrate bias as a parameter. As a result, when a substrate (well) bias voltage is 0V, with a write time of 10 ms, almost no data is written. At a substrate bias voltage of more than −2V, variation of the threshold voltage is observed for about 1 ms. With increasing the drain voltage when writing data, it is learned that the write speed can be increased. In this case, a drain voltage of more than 3V enables a high speed write operation of less than 100 μm.

The above explanation related to the case of writing the second bit of data at a second local portion, but it is also possible to write data not only at the second local portion but also the first local portion. In this case, it is preferable to make the write conditions in the case of writing data at the first local portion, that is, the sub-source line SSL side, the same as the case of writing data at the second local portion, that is, the sub-bit line SBL side, after switching the functions of the source and the drain. Therefore, as shown in FIG. 11B, the high concentration channel region HR has to be formed at not only a channel region portion contacting the sub-bit line SBL but also a channel region portion contacting the sub-source line SSL. When writing the first bit of data in the first local portion, the polarity of the voltage applied to the source and the drain is made the reverse of the above and the first and the second source-drain regions are supplied with a voltage of 3.5V for example. At that time, the other voltage application conditions are similar to the case of writing the second bit of data explained above. Due to this, the first bit of data is written at the sub-source line SS side (first local portion) of the charge storing film CHS.

By writing two bits of data as explained above, the operational voltage can be reduced compared with the related art.

For example, in the channel hot electron injection method of the related art, the bias conditions for injecting the same amounts of charge in the same amount of time at the charge storing film CHS were a drain voltage of 4.5V and a gate voltage of 9V.

On the other hand, in the present embodiment, the drain voltage able to provide a sufficient write speed is 3.3 to 4V and the gate voltage able to give the same is 5 to 6V. Therefore, the present embodiment has the merit of being able to operate by a lower voltage than the related art, for example, a drain voltage of 0.5 to 1.2V and a gate voltage of 3 to 4V. As a result, the scaling of the gate length is improved compared with the related art. Further, a write time of less than 100 μs can be obtained.

The two bits of data can be erased one at a time in the same way as in the first embodiment or erased together simultaneously. Note that when erasing only one of the two bits of data, the source line or the bit line of the non-erased side is controlled to an electrically floating state (opened) for example.

In the reverse read operation, the two bits of data are read out. A read drain voltage is applied using the source-drain region of the local side where the bit of data to be read is stored as the source and using the other source-drain region as the drain. Therefore, in the cases of reading the first bit of data and reading the second bit of data, the polarity of the read drain voltage becomes reverse.

The operations of the memory cell array are performed by voltages supplied from various drivers of the memory peripheral circuits.

The memory peripheral circuits generate the first polarity voltage (5 to 6V) and the second polarity voltage (−3V) to give a potential difference therebetween of a second voltage (8 to 9V) to be supplied between the gate and the substrate when writing data. The first polarity voltage (5 to 6V) is supplied to the gate electrode, for example, the word line WL, while the second polarity voltage (−3V) is supplied to the semiconductor substrate, for example, the p-well W.

Also, when erasing data, the memory peripheral circuits generate the first polarity voltage (5 to 6V) and the second polarity voltage (−5 or −6V) to give a potential difference therebetween of a third voltage (10 to 12V) to be supplied between the gate and the substrate. The first polarity voltage (5 to 6V) is supplied to the second source-drain region and the well, while the second polarity voltage (−5V) is supplied to the gate.

In the third embodiment, by increasing the charge injection efficiency and using a write method using collisional ionization and formation of a high concentration channel region, it becomes possible to write data with a high speed. In particular, along with formation of the high concentration channel region, the charge injection efficiency is greatly improved. On the other hand, the threshold voltage of the channel directly under the local portion written with the bit of data is increased. Note that the increase of the threshold voltage is a common phenomenon in the case of the CHE injection or forming a high concentration channel region.

In the present embodiment, similar to the first embodiment, a silicon oxynitride film is formed over a gate insulating film GD. The nitridation when forming it causes an increase of the nitrogen concentration in the gate insulating film GD. As a result, the positive fixed charges in the film and near the interface of the substrate are increased, the hole current is increased, and the threshold voltage is greatly reduced. For example, when reading a bit of data by a gate read voltage of about 3.3V, the threshold voltage of the erase side has to be suppressed to about 2.5V, but the threshold voltage which had risen to 3 to 4V when not performing thermal nitridation and just forming the high concentration channel region can be decreased to 1.5 to 2V due to the thermal nitridation. As a result, for the first time, a high speed write method increasing the intensity of the electric field by the high concentration channel region and the low voltage reverse read method can both be used due to the thermal nitridation. Note that the effect of decreasing the threshold voltage is the same in the case of the CHE injection explained above as well.

Modifications

The first to the third embodiments explained above can be modified in various ways as explained below. For example, the structure of the memory transistor can be changed in various ways. These modifications will be explained below.

The memory transistor does not have to be formed on a semiconductor substrate. The "semiconductor substrate on which a channel formation region is defined at a surface region" of the present invention includes not only a substrate bulk, but also a well such as the first embodiment. In the case of an SOI-type substrate structure, the substrate is formed with the insulating film and the insulating film is formed with the SOI semiconductor layer. The SOI semiconductor layer in this case can be used as the "semiconductor substrate on which a channel formation region is defined at a surface region" in the present invention.

The high concentration channel region HR does not have to be formed in the embodiments. However, if forming the high concentration channel region HR, the electron injection efficiency is higher than a structure not having the same.

The high concentration channel region HR and a low concentration impurity region LDD are preferably both formed. In this case, since the low concentration impurity region LDD functions as a low resistance region for the channel drift carriers (electron), the resistance relative to the adjoining high concentration channel region HR becomes higher and therefore a greater voltage drop easily occurs at the high concentration channel region. Due to this, the sharpness of the electric field in the channel direction is greater at the high concentration channel region HR and the electron implantation efficiency becomes higher by that amount. Therefore, further higher speed writing becomes possible.

The bottom insulating film BTM may have a film of another material between the lower silicon dioxide film and the upper silicon oxynitride film. Further, the material of the top insulating film TOP may be not only silicon dioxide, but also silicon nitride, silicon oxynitride, aluminum oxide, tantalum oxide, or zirconium oxide having higher dielectric constants than silicon dioxide. The material of the top insulating film TOP may also be another metal oxide film, for example, a film formed by an oxide of titanium, hafnium, and lanthanum, or a film formed by a silicate of tantalum, titanium, zirconium, hafnium, or lanthanum. Note that, for making the gate voltage lower, it is desirable to select a material having a higher dielectric constant than silicon dioxide.

While the invention has been described with reference to specific embodiments chosen for purpose of illustration, it should be apparent that numerous modifications could be made thereto by those skilled in the art without departing from the basic concept and scope of the invention.

What is claimed is:

1. A nonvolatile semiconductor memory device comprising:
    a semiconductor substrate;
    a channel formation region defined at a surface region of said semiconductor substrate including a high concentration channel region HR for producing a higher electron injection efficiency;
    a first source-drain region formed at a surface region of said semiconductor substrate at one side of said channel formation region;
    a second source-drain region formed at a surface region of said semiconductor substrate at another side of said channel formation region;
    a gate insulating film including a bottom insulating film, a charge storing film, and a top insulating film successively formed on at least said channel formation region, and
    a gate electrode formed on said top insulating film,
    wherein said bottom insulating film comprises a plurality of layers including a silicon oxynitride film directly under said charge storing film and a silicon dioxide layer adjacent said silicon oxynitride film;
    wherein said memory device comprises a read voltage application circuit for applying a read-drain voltage between said first and second source-drain regions, where the source-drain region at a side of a local portion of said charge storing film at one of said first and second source-drain regions functions as a source, and other source-drain region functions as a drain, when reading a bit of data corresponding to charges injected and stored at the local portion of said charge storing film at one of said first and second source-drain regions.

2. The nonvolatile semiconductor memory device as set forth in claim 1, wherein:
    said charge storing film is formed by a nitride film
    said bottom insulating film comprises a silicon dioxide film and a silicon oxynitride film.

3. The nonvolatile semiconductor memory device as set forth in claim 1, wherein said top insulating film is formed by a dielectric material having a larger dielectric constant than silicon dioxide.

4. The nonvolatile semiconductor memory device as set forth in claim 1, wherein said read voltage application circuit reads a first bit of data corresponding to charges stored at a first local portion, among two bits of data corresponding to charges injected and stored independently at a first local portion at said first source-drain region side of said charge storing film and a second local portion at said second source-drain region side, by applying a first read drain voltage between said first and second source-drain regions using said first source-drain region as a source and said second source-drain region as a drain and reads a second bit of data corresponding to charges stored at said second local portion by applying a second read drain voltage having a reverse polarity to said first read drain voltage and having same potential between said first and second source-drain regions.

5. The nonvolatile semiconductor memory device as set forth in claim 1, wherein said first source-drain region is a sub-source line SSL and the second source-drain region is a sub-bit line SBL, said channel formation region extending substantially between said sub-source line SSL and said sub-bit line SBL, said gate electrode is a word line W.

6. The nonvolatile semiconductor memory device as set forth in claim 5, wherein the word line comprises polycrystalline silicon doped with a p-type or an n-type impurity at a high concentration sufficient to make it conductive, a refractory metal silicide, or a multilayer film of the doped polycrystalline silicon and the refractory metal silicide.

7. The nonvolatile semiconductor memory device as set forth in claim 5 wherein an active portion of said word line WL is a length in the channel direction corresponding to a distance between the source region and the drain region not greater than 250 nm.

8. The nonvolatile semiconductor memory device as set forth in claim 5 wherein the channel formation region CH contacts said sub-bit line SBL, and said high concentration channel region HR is a p-type with a higher concentration than the channel formation region CH, so that said high concentration channel region HR increases the intensity of an electric filed in a channel direction at the portion contacting the channel formation region CH.

9. The nonvolatile semiconductor memory device as set forth in claim 8 wherein a second high concentration region SR contacts the sub-source region SSL.

10. The nonvolatile semiconductor memory device as set forth in claim 1 wherein the thickness of the bottom insulation film is between 2 to 9 nm.

* * * * *

UNITED STATES PATENT AND TRADEMARK OFFICE
CERTIFICATE OF CORRECTION

PATENT NO. : 7,075,143 B2 Page 1 of 1
APPLICATION NO. : 10/861570
DATED : June 7, 2004
INVENTOR(S) : Ichiro Fujiwara It is certified that error appears in the above-identified patent and that said Letters Patent is hereby corrected as shown below:

<u>Column 19</u>:
Line 2, "filed" should read -- field --.

Signed and Sealed this

Seventeenth Day of October, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,075,143 B2 | Page 1 of 1 |
| APPLICATION NO. | : 10/861570 | |
| DATED | : July 11, 2006 | |
| INVENTOR(S) | : Ichiro Fujiwara | |

It is certified that error appears in the above-identified patent and that said Letters Patent is hereby corrected as shown below:

<u>Column 19</u>:
Line 2, "filed" should read -- field --.

This certificate supersedes Certificate of Correction issued October 17, 2006.

Signed and Sealed this

Twenty-first Day of November, 2006

JON W. DUDAS
*Director of the United States Patent and Trademark Office*